US009455247B2

(12) United States Patent
Galy et al.

(10) Patent No.: US 9,455,247 B2
(45) Date of Patent: Sep. 27, 2016

(54) HIGH-PERFORMANCE DEVICE FOR PROTECTION FROM ELECTROSTATIC DISCHARGE

(71) Applicant: STMicroelectronics SA, Montrouge (FR)

(72) Inventors: Philippe Galy, Le Touvet (FR); Jean Jimenez, Saint Theoffrey (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/087,622

(22) Filed: Mar. 31, 2016

(65) Prior Publication Data
US 2016/0218098 A1 Jul. 28, 2016

Related U.S. Application Data

(62) Division of application No. 13/457,134, filed on Apr. 26, 2012, now Pat. No. 9,324,703.

(30) Foreign Application Priority Data

May 12, 2011 (FR) ..................... 11 54120

(51) Int. Cl.
*H01L 29/747* (2006.01)
*H01L 23/60* (2006.01)
(Continued)

(52) U.S. Cl.
CPC ....... *H01L 27/0255* (2013.01); *H01L 27/0248* (2013.01); *H01L 27/0292* (2013.01); *H01L 29/747* (2013.01); *H01L 29/7416* (2013.01); *H01L 23/60* (2013.01); *H01L 23/62* (2013.01)

(58) Field of Classification Search
CPC .......... H01L 27/0248; H01L 27/0292; H01L 29/747; H01L 23/60; H01L 23/62
See application file for complete search history.

(56) References Cited

U.S. PATENT DOCUMENTS 4,282,568 A * 8/1981 Kobayashi ........... H02H 7/1206
327/460
5,880,488 A 3/1999 Yu
(Continued)

FOREIGN PATENT DOCUMENTS

CN 1812098 A 8/2006
CN 202678313 U 1/2013
(Continued)

OTHER PUBLICATIONS

République Francaise Institut National De La Propriété Industrielle, Rapport De Recherche Préliminaire (Preliminary Search Report); issued in French Patent Application No. 1154120 on Oct. 27, 2011 (7 pages).

*Primary Examiner* — Eduardo A Rodela
*Assistant Examiner* — Christopher M Roland
(74) *Attorney, Agent, or Firm* — Slater Matsil, LLP

(57) ABSTRACT

A semiconductor device for protection from electrostatic discharge includes a number of modules for protection from electrostatic discharge. Each module includes a thyristor having terminals and a gate, and a diode coupled in anti-parallel to the terminals of the thyristor. Each module is sized to share a saturation current with neighboring modules when an electrostatic discharge current is received. A resistive network couples modules between two terminals. A triggering circuit includes a common triggering output that is coupled to the gate of the thyristor of each module and a common buried semiconductor layer contacts each module.

20 Claims, 5 Drawing Sheets

(51) Int. Cl.
  *H01L 23/62*  (2006.01)
  *H01L 27/02*  (2006.01)
  *H01L 29/74*  (2006.01)

(56) References Cited

U.S. PATENT DOCUMENTS

| | | |
|---|---|---|
| 7,113,377 B2 | 9/2006 | Salome et al. |
| 7,443,703 B2 | 10/2008 | Inukai et al. |
| 2002/0041007 A1 | 4/2002 | Russ |
| 2002/0153571 A1 | 10/2002 | Mergens et al. |
| 2003/0183838 A1* | 10/2003 | Huang ............ H03K 17/08148 257/107 |
| 2004/0164356 A1 | 8/2004 | Mergens et al. |
| 2006/0011939 A1 | 1/2006 | Mohn et al. |
| 2007/0262386 A1 | 11/2007 | Gossner et al. |
| 2008/0087963 A1 | 4/2008 | Calafut et al. |
| 2009/0147552 A1* | 6/2009 | Pearson ................ H02M 1/088 363/54 |
| 2010/0027174 A1 | 2/2010 | Galy et al. |
| 2010/0271741 A1* | 10/2010 | Galy ................... H01L 27/0262 361/56 |
| 2011/0042747 A1 | 2/2011 | Galy et al. |
| 2012/0286321 A1 | 11/2012 | Galy et al. |

FOREIGN PATENT DOCUMENTS

| | | |
|---|---|---|
| EP | 2246885 A1 | 11/2010 |
| EP | 2290691 A1 | 3/2011 |
| FR | 2838881 A1 | 10/2003 |
| WO | 02075892 A1 | 9/2002 |

* cited by examiner

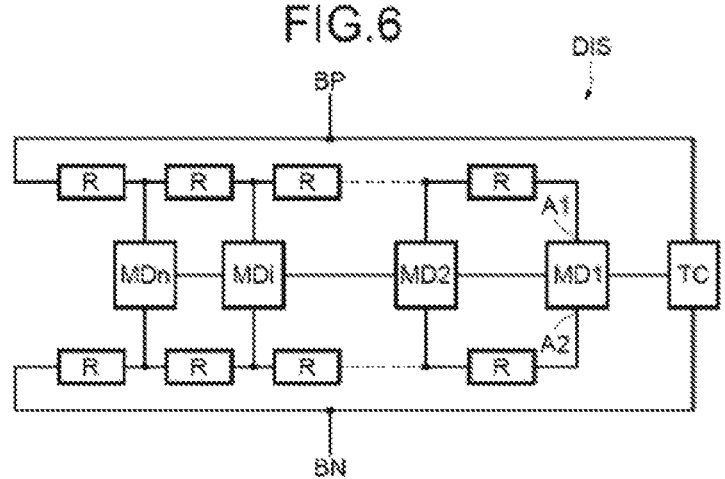
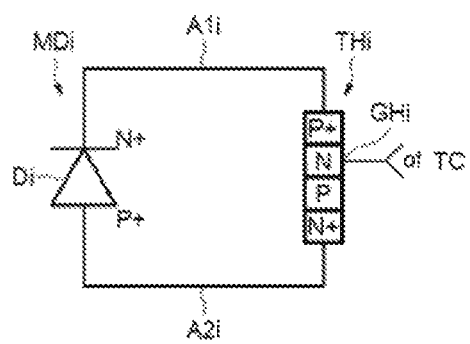
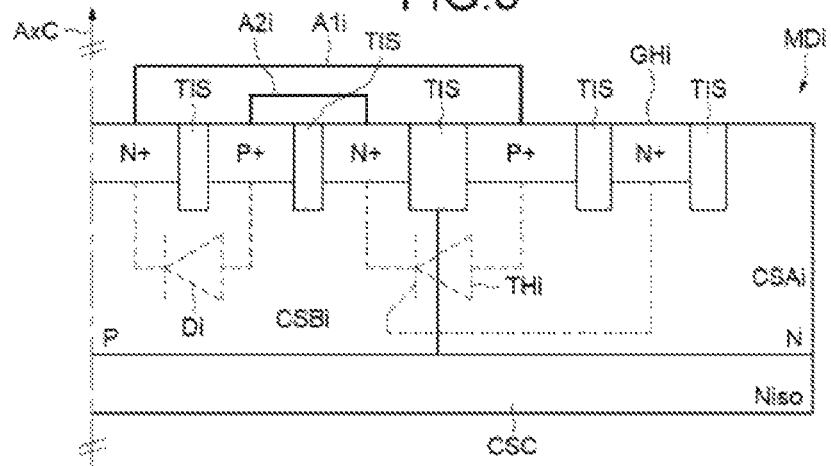

HIGH-PERFORMANCE DEVICE FOR PROTECTION FROM ELECTROSTATIC DISCHARGE

This is a divisional application of U.S. application Ser. No. 13/457,134, filed on Apr. 26, 2012, which application further claims the benefit of French Patent Application No. 1154120, filed on May 12, 2011, which applications are hereby incorporated by reference to the maximum extent allowable by law.

TECHNICAL FIELD

The present invention relates generally to electronic devices, and in particular to those intended for the protection of components from electrostatic discharge.

BACKGROUND

An electrostatic discharge (ElectroStatic Discharge: ESD) results, for example, in a current peak of 30 amps in one nanosecond followed by a current of 10 amps over 10 nanoseconds.

A first approach for protection consists in using a single protection circuit, for example a large-sized triac, associated with triggering means. However, although such a circuit is effective for absorbing strong ESD discharges, it is not efficient at triggering rapidly in the presence of weak ESD discharges.

A second approach consists in using several ESD protection circuits, of smaller size, each associated with a triggering circuit. Such protection means are this time efficient in the presence of weak ESD discharges but not effective in the presence of strong ESD pulses because the triggering of a single protection circuit does not guarantee a triggering of the other protection circuits.

An example of an ESD protection structure is described in the European patent application published under the number 2 246 885 A1, incorporated herein by reference. This structure comprises a set of identical cells arranged as a ring matrix in such a way as to form triplets of triggerable triacs. As the anode-cathode distances are not identical for all of the triacs of a triplet, this can be penalizing in terms of efficiency. Moreover, in certain cases, dead zones can exist between the consecutive triggerings of several triplets which can result, during the ESD event, in overvoltage peaks at the terminals of the component or of the contact to be protected.

SUMMARY OF THE INVENTION

These and other problems are generally solved or circumvented, and technical advantages are generally achieved, by preferred embodiments.

In one aspect, embodiments of the present invention provide for a semiconductor device for protection from electrostatic discharge, comprising a plurality of modules having triggerable elements coupled with triggering means. The modules are connected between two terminals by the intermediary of a resistive network. A common semiconductor layer contacts all of the modules. Each triggerable element having at least one gate. Each module is sized in order to be in a state of saturation in the presence of electrostatic discharge. The triggering means comprises a single triggering circuit common to all of the triggerable elements and having an output connected to the respective gates of all of the triggerable elements.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1 to 9 are diagrammatic illustrations of different embodiments of a device according to embodiments of the invention.

DETAILED DESCRIPTION OF ILLUSTRATIVE EMBODIMENTS

Figure 1:
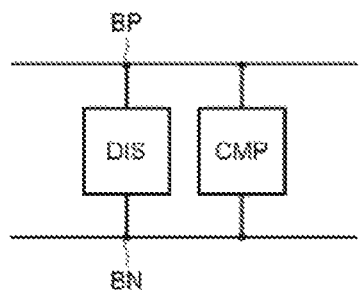

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Before addressing the illustrated embodiments in detail, various embodiments and advantageous features thereof will be discussed generally in the following paragraphs.

According to one embodiment, there is proposed a device for protection from electrostatic discharges which makes it possible to be effective with respect to weak ESD discharges and fast with respect to large ESD discharges, whilst reducing the risk of appearance of dead zones during an ESD event.

According to one aspect, there is proposed a semiconductor device for protection from electrostatic discharges, comprising several modules for protection from electrostatic discharges comprising triggerable elements coupled with triggering means, the said modules being connected between two terminals by the intermediary of a resistive network.

According to a general feature of this aspect, the device comprises a common semiconductor layer contacting all of the modules, each triggerable element having at least one gate, each module being sized in order to be in a state of saturation in the presence of the said electrostatic discharge, the triggering means comprise a single triggering circuit common to all of the triggerable elements and whose output is connected to the gates of all of the triggerable elements.

The sizing of the ESD protection module is carried out in such a way that this module reaches saturation during the ESD event. Once saturated, the module is traversed by a current greater than the saturation current and the excess current is diffused by the module into the common semiconductor layer.

Moreover, because of the presence of this common semiconductor layer contacting all of the modules, as soon as one of the modules has triggered, this excess current contributes to the triggering of the closest neighboring module or modules of the said module. In other words, the saturation current is shared step by step by all of the modules and each saturated module contributes to triggering its closest neighbor or neighbors by the domino effect, thus greatly reducing the risk of appearance of dead zones.

This therefore makes it possible to have a very fast triggering of the protection modules and to be able to absorb strong electrostatic discharges whilst avoiding the breakdown of the individual protection modules which can also be of small size. The structure of the protection modules can be very diverse.

Thus, each module can comprise a triac forming the said triggerable element of the module or again, for example, a thyristor forming the said triggerable element of the module and a diode connected in antiparallel to the terminals of the thyristor. The modules can be arranged as a matrix network. According to another aspect, there is proposed an integrated circuit comprising at least one device such as defined above.

Turning now to the illustrated embodiments, in FIG. 1, the reference DIS denotes an electronic device forming a device for protecting an electronic component CMP from electrostatic discharges (ElectroStatic Discharges: ESD). The component CMP is connected to a first terminal BP and to a second terminal BN of the device DIS. The assembly can be part of an integrated circuit.

By way of indication, when the component CMP is functioning, the terminal BP can be connected to a positive voltage VP and the terminal BN can be connected to a negative voltage VN or to a zero voltage (ground).

When the component CMP is not functioning, it can be subjected to an electrostatic discharge typically resulting in a very brief current pulse which can reach several amps. It is desirable for this current pulse to pass through the device DIS and not through the component CMP to be protected. The device DIS consequently aims to absorb this current pulse and to avoid overvoltages at the terminals of the component CMP.

It is appropriate to note that the terminals BP and BN of the device can also be connected respectively, for example, to an input/output contact of, e.g., a printed circuit and to a ground rail, or to an input/output contact of an integrated circuit and to a power supply rail.

Figure 2:
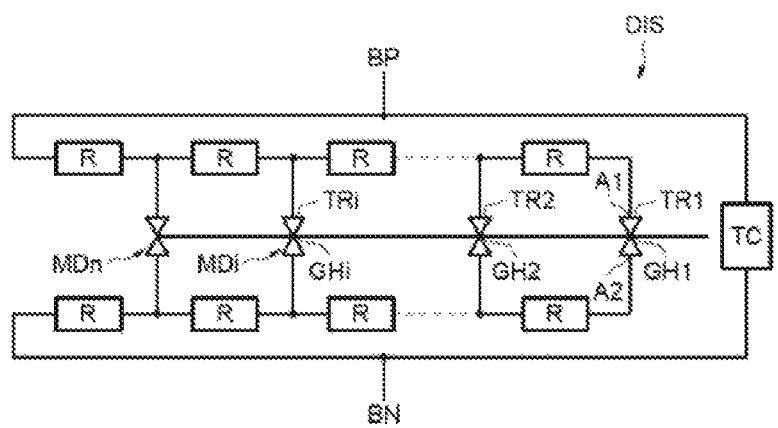

The device DIS comprises, as shown in FIG. 2, several modules MDi for protection from electrostatic discharges. These modules MDi comprise triggerable elements, for example triacs in FIG. 2, coupled to triggering means comprising a single triggering circuit TC common to all of the triggerable elements. The modules MDi are connected between the two terminals BN and BP of the device DIS by the intermediary of a resistive network R.

As will be seen in greater detail hereafter, the device DIS comprises a common semiconductor layer contacting all of the modules and the output of the triggering circuit TC is connected to the gates of all of the triggerable elements.

Each module MDi by itself forms an ESD protection module. It is moreover sized such that it reaches saturation during an ESD event having a chosen threshold, for example 2 kVolts HBM (Human Body Model).

The HBM test corresponds to the discharge current generated by a person touching a component connected to ground with the tip of his or her finger. The electrical circuit making it possible to simulate this type of discharge conventionally comprises a capacitor, typically of value 100 picofarads, in series with a resistor, typically of value 1500 Ohms, the circuit being connected to the component under test. The capacitor is then charged up to a voltage of the order of a few kilovolts.

The corresponding ESD pulse corresponds to a current pulse whose mean duration is 300 nanoseconds with a current peak varying between 1 and 3 amps depending on the value of the precharge voltage.

Other models are possible, for example such as the MM (Machine Model) or CDM (Charged Device Model) models. The MM model corresponds to an ESD discharge which would be produced by a machine touching the component or a person manipulating a metal tool touching the component. The MM model is substantially the same as the HBM model but with different capacitor and resistor values.

The CDM model differs from the HBM and MM models and makes it possible to simulate a charged component which discharges through at least one of its pins contacting for example a ground plane. Such an ESD discharge is then in the form of a current pulse of high amplitude (typically 15 amps) over an extremely short period, typically one nanosecond.

Those skilled in the art will easily know how to size the module MDi so that it reaches saturation in the presence of the ESD event, knowing the value Imax of the maximum ESD current (for example 1.33 amps for 2 kVolts HBM) and the value Jsat of the saturation current of the material through which this current is to pass, for example silicon. This saturation current depends on many parameters such as the doping, the temperature, the topology, and the like. In general, the value of this saturation current is obtained by simulation using well known simulation models.

Taking account of the fact that the current Imax is equal to the product of the saturation current Jsat and the area S of the electrodes of the module, it then becomes easy to size the electrodes of the module such that it goes into its saturated state when Imax is greater than the product Jsat×S in order to obtain an excess current which will be diffused in the common semiconductor layer and contribute to the triggering of the closest neighbor or neighbors of the module MDi.

In the example shown in FIG. 2, each module MDi comprises, as mentioned above, a triac TRi forming the triggerable element of the module. The output of the triggering circuit TC is connected to the gates GHi of the triacs TRi and the two electrodes A1 and A2 of a triac are connected to the electrodes A1 and A2 of a neighboring triac by the intermediary of two resistors R of the resistive network.

Figure 3:
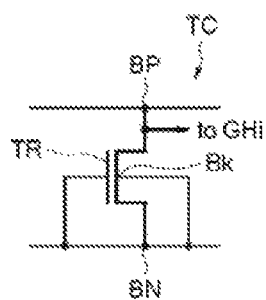

Any known triggering circuit is appropriate. It is for example possible to mention, as shown in FIG. 3, a transistor TR, for example an NMOS transistor, having its gate, its source and its substrate BK connected to the terminal BN of the device, and its drain connected to the terminal BP. The drain of the transistor TR thus forms the output of the circuit TC connected to the gates GHi of the triacs.

Figure 4:
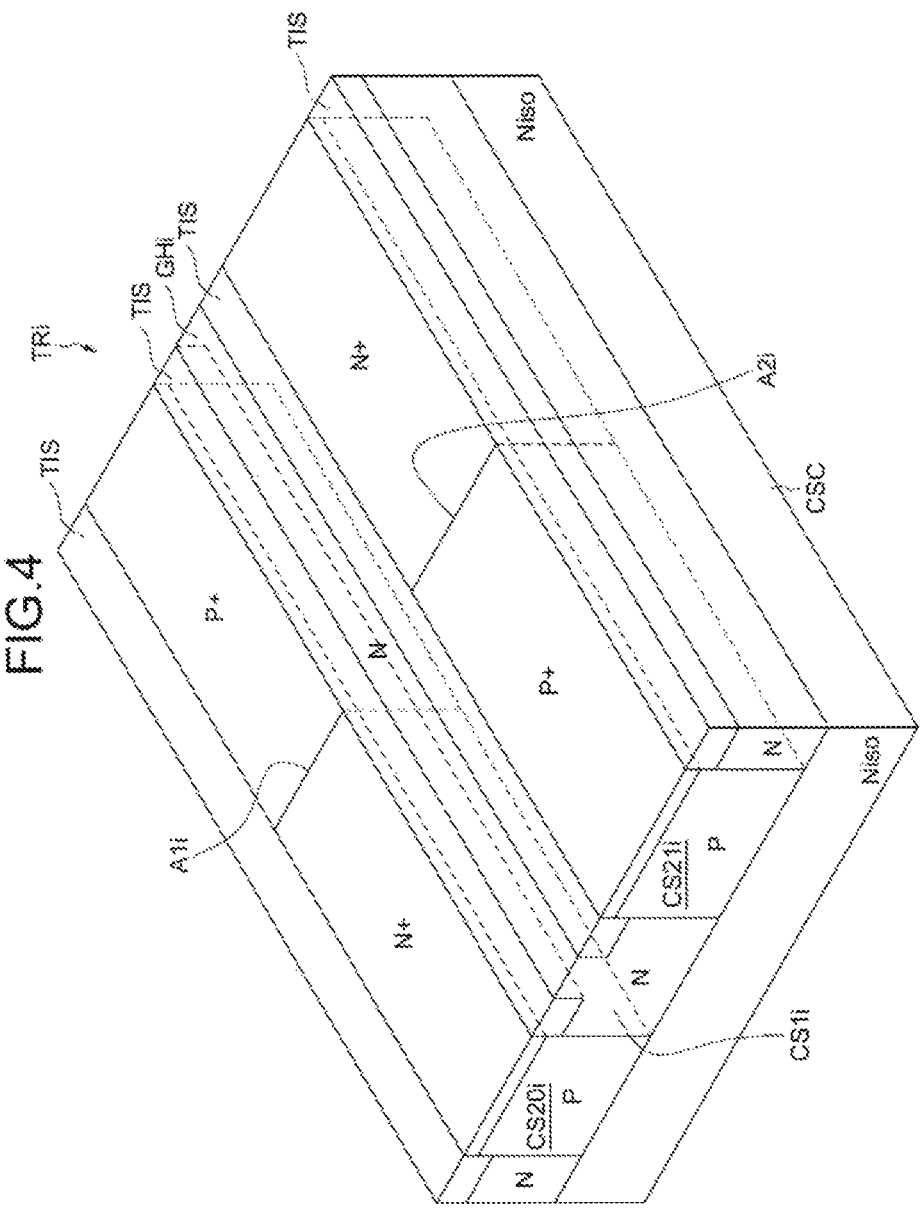

Even though it is possible to use any type of triac, it is particularly advantageous, in particular for reasons of size, to use a triac with a single gate of the type of the one shown in FIG. 4.

More precisely, in this example, the triac TRi with a single gate GHi comprises a first semiconductor block CS1*i* having a first type of conductivity, for example N-type conductivity, forming the gate GHi of the triac and two second semiconductor blocks CS20*i* and CS21*i* having a second type of conductivity, opposite to that of the first one, in this case P-type conductivity. These two blocks CS20*i* and CS21*i* are arranged on either side of the first block CS1*i*.

Moreover, an N+ doped zone and a P+ doped zone, mutually in contact, both contact the block CS20*i* and form the electrode A1*i* of the triac TRi. Similarly, a P+ doped zone and an N+ doped zone, mutually in contact, both contact the second block CS21*i* and form the second electrode A2*i* of the triac TRi.

The P+ and N+ zones are isolated from the first block CS1*i* by isolation trenches TIS, of the STI (Shallow Trench Isolation) type. Similarly, isolation trenches TIS laterally isolate the N+ and P+ zones of the triac TRi towards the outside. Each pair of zones (N+, P+), mutually facing and separated by the block CS1*i*, forms, with the subjacent layers P and N, a demi-triac (thyristor).

Moreover, a buried semiconductor layer CSC (N-doped and commonly called a "Niso layer") contacts the first and second blocks of the triac TRi and more generally the blocks of all of the triacs TRi. This is illustrated more precisely in FIG. 5 where the device DIS comprises six modules (six triacs TRi) with the common semiconductor layer CSC contacting all of the triacs. Moreover, the gates GH1-GH6 of the triacs TR1-TR6 are connected by metallisations MTL to the output of the triggering circuit TC.

Because of the presence of the common semiconductor layer CSC, the saturation current is shared step by step by all of the modules. Moreover, even if all of the gates of all of the triacs are connected to the output of the single triggering circuit, there is always one triac which will trigger first, generally the one which is located closest to the triggering circuit TC. Also, in this case, the first triac to trigger will go into saturation and contribute to the triggering of its closest neighbor or neighbors.

The device according to the invention makes it possible to combine speed of triggering and ability to absorb strong electrostatic discharges.

Moreover, the presence of a single triggering circuit TC and the non-necessity of having a guard ring between each module (since all of the modules are contacted by the common semiconductor layer) allows a reduction of the overall dimensions on silicon.

As mentioned above and as shown in FIG. 6, the thyristors TRi can be replaced by modules MDi for protection from electrostatic discharges and can be structured different from the one shown in FIG. 2.

Thus, each module MDi can comprise, as shown in FIG. 7, a thyristor THi forming the said triggerable element of the module and a diode Di connected in antiparallel to the terminals of the thyristor.

More precisely, the cathode N+ of the diode Di forms the electrode A1i of the module MDi and is connected to the P+ layer of the thyristor THi. Moreover, the anode P+ of the diode Di, which forms the other electrode A2i of the module MDi, is connected to the N+ zone of the thyristor THi. The output of the triggering circuit TC is connected to the gate GHi of the thyristor THi.

A particularly advantageous example, in particular in terms of overall dimensions, of such a module MDi is shown in FIG. 8. In this figure, each module has a concentric structure. Such a structure is, for example, described in the European patent application Number 2 290 691, incorporated herein by reference, to which those skilled in the art can refer for information. The principal features of such a structure are nevertheless recalled with reference to FIG. 8.

The module MDi has an axis of symmetry AxC and comprises two blocks CSAi and CSBi having opposite types of conductivity. Thus, for example, the block CSAi has N-type conductivity whilst the block CSBi has P-type conductivity.

Figure 9:
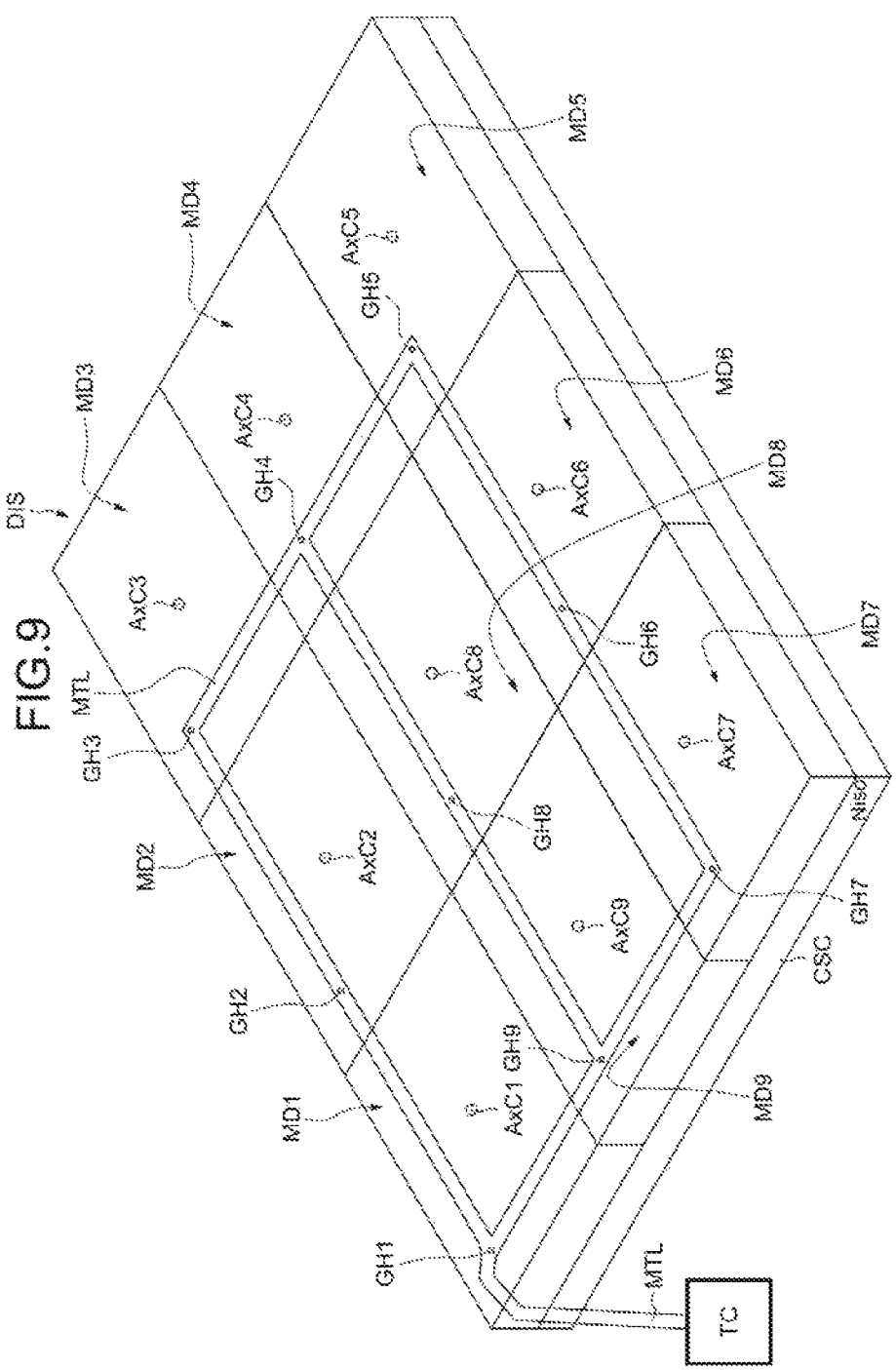

The semiconductor layer CSC (Niso) is here again a buried layer contacting both blocks of the module MDi and more particularly both blocks of all the modules MDi as shown in FIG. 9.

The module MDi moreover comprises N+, P+ and N+ regions mutually separated by isolation regions TIS and contacting the block CSBi, as well as P+ and N+ regions also separated by isolation regions TIS and contacting the block CSAi.

As shown in FIG. 8 in dotted line, this structure makes it possible to form the thyristor THi and the diode Di, the gate GHi of the thyristor being formed by the N+ zone contacting the block CSAi.

Moreover, metallisations connect the different P+ and N+ zones in such a way as to form the electrodes A1i and A2i of the module MDi.

Figure 5:
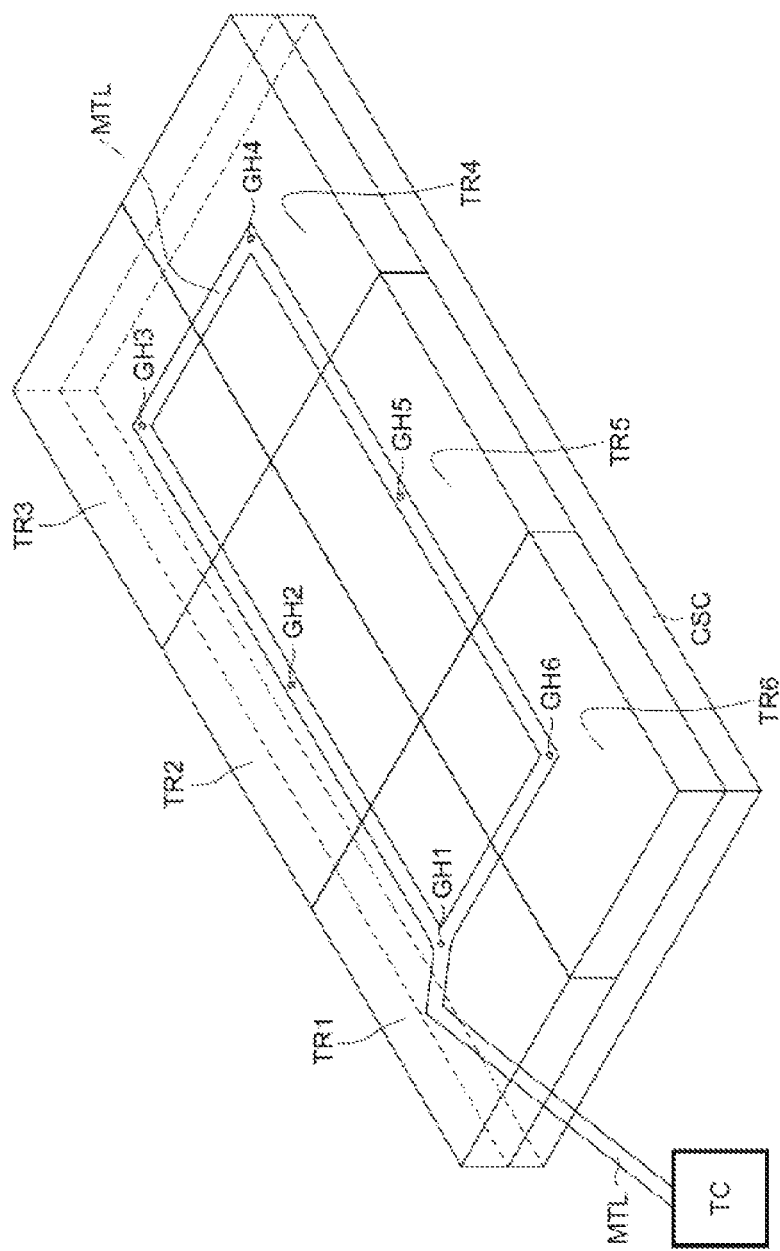

By analogy with what was described in FIG. 5, the modules MDi can also be arranged as a matrix network as shown in FIG. 9, this network being able to be of any form. In FIG. 9, a matrix of three lines and three columns has been shown, consequently comprising nine modules MD1-MD9. The gates GH1-GH9 of these modules are all connected by metallisations MTL to the output of the single triggering circuit TC. The common semiconductor layer CSC contacts the blocks of all the modules MDi allowing, in a similar way to that described above, a sharing of the saturation current of the different modules and a step by step triggering of the modules. The axis of symmetry AxC for each of the nine modules MD1-MD9 is labeled AxC1-AxC9, respectively.

The device of the invention allows in particular an effective protection of the inputs-outputs and/or of the inner cores of the integrated circuits from fast low-current ESD discharges and from high current ESD discharges no matter what technology is used. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device for protection from electrostatic discharge, the semiconductor device comprising:
   a plurality of modules for protection from electrostatic discharge, each module of the plurality of modules comprising:
      a thyristor having terminals and a gate, and
      a diode coupled in antiparallel to the terminals of the thyristor, wherein each module of the plurality of modules is sized to share a saturation current with neighboring modules of the plurality of modules when an electrostatic discharge current is received;
   a resistive network coupling the plurality of modules between two terminals;
   a triggering circuit comprising a common triggering output, wherein the common triggering output is coupled to the gate of the thyristor of each module of the plurality of modules; and
   a common buried semiconductor layer contacting each module of the plurality of modules.

2. The semiconductor device according to claim 1, wherein each module of the plurality of modules has a concentric structure comprising two blocks having respectively opposite types of conductivity and the common buried semiconductor layer contacts the two blocks of each module of the plurality of modules.

3. The semiconductor device according to claim 1, wherein the plurality of modules are arranged as a matrix network.

4. The semiconductor device according to claim 1, wherein the thyristor of each module of the plurality of modules comprises:
   a first semiconductor block having a first conductivity type, the first semiconductor block being on and in physical contact with the common buried semiconductor layer;
   a second semiconductor block having a second conductivity type, the second semiconductor block being on and in physical contact with the common buried semiconductor layer;
   a first highly doped semiconductor region disposed in the second semiconductor block and having the second conductivity type, wherein the gate of the thyristor comprises the first highly doped semiconductor region;
a second highly doped semiconductor region disposed in the second semiconductor block and having the first conductivity type, wherein a first terminal of the terminals of the thyristor comprises the second highly doped semiconductor region;
a third highly doped semiconductor region disposed in the first semiconductor block and having the second conductivity type, wherein a second terminal of the terminals of the thyristor comprises the third highly doped semiconductor region;
a first isolation region disposed in the second semiconductor block between the first highly doped semiconductor region and the second highly doped semiconductor region; and
a second isolation region disposed in the first semiconductor block and the second semiconductor block between the second highly doped semiconductor region and the third highly doped semiconductor region.

5. The semiconductor device according to claim 1, wherein the plurality of modules are interconnected in a daisy chain fashion.

6. The semiconductor device according to claim 1, wherein the triggering circuit comprises a field effect transistor (FET).

7. The semiconductor device according to claim 6, wherein the field effect transistor is an n-type FET having a gate and source terminal coupled to a second voltage terminal of the two terminals and having a drain coupled to a first voltage terminal of the two terminals and further coupled to respective gates of the thyristor of each module of the plurality of modules.

8. An integrated circuit comprising:
a first voltage rail and a second voltage rail;
a circuit component connected between the first and second voltage rails; and
an electrostatic discharge protection device comprising:
a trigger circuit,
a plurality of modules, each module of the plurality of modules comprising a thyristor having a first terminal coupled to the first voltage rail, a second terminal coupled to the second voltage rail, and a gate coupled to the trigger circuit, wherein each module of the plurality of modules is configured to reach a saturation state and to share a saturation current with neighboring modules of the plurality of modules when an electrostatic discharge current is received, and
a common buried semiconductor layer in contact with each module of the plurality of modules.

9. The integrated circuit of claim 8, further comprising a resistive network interconnecting respective first terminals of the thyristor of each module of the plurality of modules and the first voltage rail and interconnecting respective second terminals of the thyristor of each module of the plurality of modules and the second voltage rail.

10. The integrated circuit of claim 8, wherein the trigger circuit comprises a field effect transistor (FET).

11. The integrated circuit of claim 10, wherein the field effect transistor is an n-type FET having a gate and source terminal coupled to the second voltage rail and having a drain coupled to the first voltage rail and further coupled to respective gates of the thyristor of each module of the plurality of modules.

12. The integrated circuit of claim 8, wherein the plurality of modules are arranged in a matrix network.

13. The integrated circuit of claim 8, wherein the plurality of modules are interconnected in a daisy chain fashion.

14. The integrated circuit of claim 8, wherein the thyristor of each module of the plurality of modules comprises:
a first semiconductor block having a first conductivity type, the first semiconductor block being on and in physical contact with the common buried semiconductor layer;
a second semiconductor block having a second conductivity type, the second semiconductor block being on and in physical contact with the common buried semiconductor layer;
a first highly doped semiconductor region disposed in the second semiconductor block and having the second conductivity type, wherein the gate of the thyristor comprises the first highly doped semiconductor region;
a second highly doped semiconductor region disposed in the second semiconductor block and having the first conductivity type, wherein the first terminal of the thyristor comprises the second highly doped semiconductor region;
a third highly doped semiconductor region disposed in the first semiconductor block and having the second conductivity type, wherein the second terminal of the thyristor comprises the third highly doped semiconductor region;
a first isolation region disposed in the second semiconductor block between the first highly doped semiconductor region and the second highly doped semiconductor region; and
a second isolation region disposed in the first semiconductor block and the second semiconductor block between the second highly doped semiconductor region and the third highly doped semiconductor region.

15. A device comprising:
a common buried semiconductor layer;
a triggering device; and
a plurality of triggerable devices, each triggerable device comprising
a thyristor having a gate coupled to the triggering device, and
a diode configured in antiparallel to the thyristor, wherein
each triggerable device of the plurality of triggerable devices is in contact with the common buried semiconductor layer, and
each triggerable device of the plurality of triggerable devices is sized to reach a saturation state and to share a saturation current with neighboring triggerable devices of the plurality of triggerable devices when an electrostatic discharge current passing therethrough.

16. The device of claim 15, further comprising a circuit to be protected from electrostatic discharge coupled across a first rail and a second rail, wherein the triggering device is coupled across the first rail and the second rail.

17. The device of claim 15, further comprising a resistive network, wherein
each triggerable device of the plurality of triggerable devices has a first terminal and a second terminal,
respective first terminals of the plurality of triggerable devices are interconnected through the resistive network, and
respective second terminals of the plurality of triggerable devices are interconnected through the resistive network.

18. The device of claim 15, wherein the triggerable devices are formed adjacent one another, separated from one another by isolation regions, and formed over the common buried semiconductor layer.

19. The device of claim 15, wherein the thyristor of each triggerable device of the plurality of triggerable devices comprises:
- a first semiconductor block having a first conductivity type, the first semiconductor block being on and in physical contact with the common buried semiconductor layer;
- a second semiconductor block having a second conductivity type, the second semiconductor block being on and in physical contact with the common buried semiconductor layer;
- a first highly doped semiconductor region disposed in the second semiconductor block and having the second conductivity type, wherein the gate of the thyristor comprises the first highly doped semiconductor region;
- a second highly doped semiconductor region disposed in the second semiconductor block and having the first conductivity type, wherein a first terminal of the thyristor comprises the second highly doped semiconductor region;
- a third highly doped semiconductor region disposed in the first semiconductor block and having the second conductivity type, wherein a second terminal of the thyristor comprises the third highly doped semiconductor region;
- a first isolation region disposed in the second semiconductor block between the first highly doped semiconductor region and the second highly doped semiconductor region; and
- a second isolation region disposed in the first semiconductor block and the second semiconductor block between the second highly doped semiconductor region and the third highly doped semiconductor region.

20. The device of claim 15, wherein the plurality of triggerable devices are arranged in a matrix network.

\* \* \* \* \*